(12) United States Patent
Lee

(10) Patent No.: US 7,663,899 B2
(45) Date of Patent: Feb. 16, 2010

(54) ACTIVE COMPENSATION DEVICE

(75) Inventor: Yu-Lung Lee, Chung Ho (TW)

(73) Assignee: Powertech Industrial Co., Ltd., Taipei Hsien (TW)

( * ) Notice: Subject to any disclaimer, the term of this patent is extended or adjusted under 35 U.S.C. 154(b) by 393 days.

(21) Appl. No.: 11/603,210

(22) Filed: Nov. 22, 2006

(65) Prior Publication Data

US 2008/0055950 A1    Mar. 6, 2008

(30) Foreign Application Priority Data

Sep. 1, 2006    (TW)    ............... 95132497 A

(51) Int. Cl.
*H02M 7/5387*    (2007.01)
*H02M 7/219*    (2006.01)
*H02M 7/12*    (2006.01)

(52) U.S. Cl. ...................... 363/132; 323/207

(58) Field of Classification Search ............... 323/207; 307/46, 66; 363/131, 40, 132
See application file for complete search history.

(56) References Cited

U.S. PATENT DOCUMENTS

| 5,321,598 | A  | * | 6/1994 | Moran ......................... 363/41 |
| 5,751,138 | A  | * | 5/1998 | Venkata et al. .............. 323/207 |
| 6,982,546 | B2 | * | 1/2006 | Wu et al. ..................... 323/205 |
| 7,091,704 | B2 | * | 8/2006 | Chou et al. .................. 323/207 |
| 2005/0207197 | A1 | * | 9/2005 | Chou et al. .................. 363/131 |

* cited by examiner

*Primary Examiner*—Gary L Laxton
*Assistant Examiner*—Nusrat J Quddus
(74) *Attorney, Agent, or Firm*—Rosenberg, Klein & Lee

(57) ABSTRACT

The present invention provides an active compensation device that is connected between a power system and a non-linear load in parallel for providing an instantaneous compensation current for the non-linear load. The active compensation device comprises an electricity-storing unit, a bridge switching unit, and a controlling unit. The bridge switching unit is connected electrically with the electricity-storing unit for charging or discharging the electricity-storing unit; the controlling unit is used to produce control signals to switch the bridge switching unit. The electricity-storing performs a dual-direction current operation by means of switching the bridge switching unit to compensate the power system so as to increase instantaneously the current capacity.

8 Claims, 5 Drawing Sheets

ACTIVE COMPENSATION DEVICE

BACKGROUND OF THE INVENTION

1. Field of the invention

The present invention relates to an active compensation device, and more particularly to the active compensation device with a dual-direction current operation.

2. Description of the Prior Art

Due to the universal of the audio & video equipment and better desired, the high-level or high-power audio & video equipment is used gradually. In order to obtain the low-noise and wide-linear stereophonic equipment, the different amplifier circuits are adapted to amplify the rectified circuit and a large capacitor is connected to reserve energy to drive the speaker. However, although the stereophonic equipment with high-power amplifier circuit can offer better sound effects, relatively, it needs larger instantaneous current due the stereophonic equipment or other audio & video equipment are non-linear loads. The larger resistance due to overlong power line or overload of the power will not offer sufficient instantaneous current to obtain expected image & sound effects.

Hence, most of consumers re-dispose the dedicated power line and use the power line with enduring high current before operating the high-power audio & video equipment so as to change the power distribution environment. In addition, in order to improve the power quality of the audio & video equipment, consumers further install the power capacitor even though it produces much reactive power and causes energy waste.

The inventor of the present invention recognizes the above shortage should be corrected and special effort has been paid to research this field. The present invention is presented with reasonable design and good effect to resolve the above problems.

SUMMARY OF THE INVENTION

The present invention provides an active compensation device to perform a dual-direction current operation that the active compensation device is adapted to backup the power provided by the power system, as the utility power when the non-linear load isn't in use. Oppositely, the active compensation device and the power system are both to supply power to the non-linear load so as to increase instantaneously the current capacity when the non-linear load is in use.

For achieving the objectives stated above, the active compensation device is connected between a power system and a non-linear load in parallel for providing an instantaneous compensation current for the non-linear load. The active compensation device is disposed near the non-linear load and comprises an electricity-storing unit, a bridge switching unit, and a controlling unit. The bridge switching unit is connected electrically with the electricity-storing unit for controlling a no-load current produced from storing the power system by the electricity-storing unit and the compensation current outputted from the electricity-storing unit. Besides, the bridge switching unit is used to control switches by the controlling unit.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The above and further advantages of this invention may be better understood by referring to the following description, taken in conjunction with the accompanying drawings, in which.

The drawings will be described further in connection with the following detailed description of the present invention.

DETAILED DESCRIPTION OF THE PREFERRED EMBODIMENTS

Figure 1:
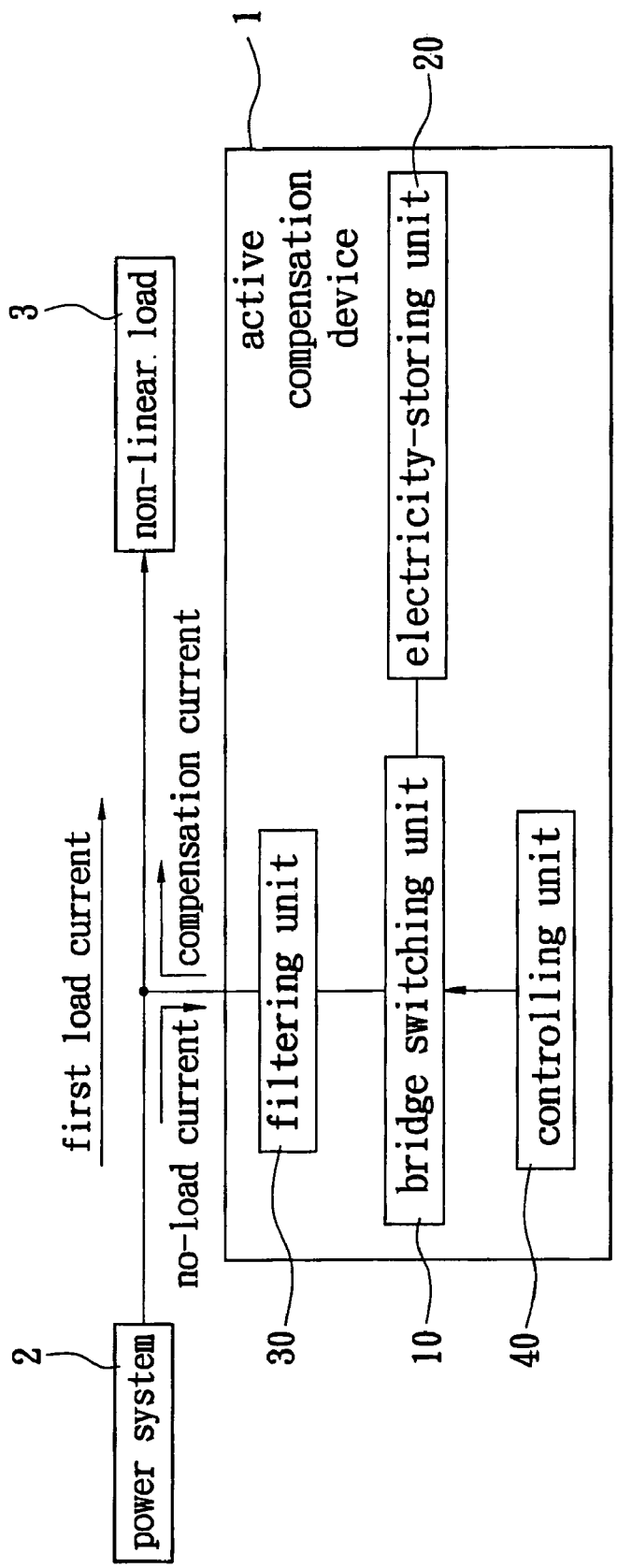
FIG. 1 is a block diagram of an embodiment of an active compensation device according to the present invention.

Reference is shown as in FIG. 1 which is a block diagram of an embodiment of an active compensation device according to the present invention. The prevent invention provides an active compensation device 1 that is connected between a power system 2 and a non-linear load 3 in parallel for providing an instantaneous compensation current C for the non-linear load 3, and the non-linear load 3 can be an audio & video apparatus which consumes larger instantaneous current. The active compensation device 1 is disposed near the non-linear load 3 to avoid reducing the compensation effect due to an overlong power line. The active compensation device 1 comprises a bridge switching unit 10, an electrically-storing unit 20, and a controlling unit 40. The bridge switching unit 10 is connected electrically with the electricity-storing unit 20 for controlling the electricity-storing unit 20 to store a no-load current B produced by the power system 2 and controlling the electricity-storing unit 20 to output the instantaneous compensation current C for the non-linear load 3. The bridge switching unit 10 includes a plurality of switches, and the switches can be insulated gate bipolar transistors (IGBTs), the IGBTs combine with diodes, or metal oxide semiconductor field effect transistors (MOSFETs). In addition, the electricity-storing unit 20 can be a battery or capacitor.

The controlling unit 40 is connected electrically with the bridge switching unit 10 for producing control signals to control switches of the bridge switching unit 10 so that the active compensation device 1 can charge or discharge the electricity-storing unit 20. Besides, the active compensation device 1 further comprises a filtering unit 30 connected electrically with the bridge switching unit 10 for filtering high frequency pulse current when the bridge switching unit 10 outputs the compensation current C to the non-linear load 3. In addition, the filtering unit 30 can be an inductor.

Figure 2B:
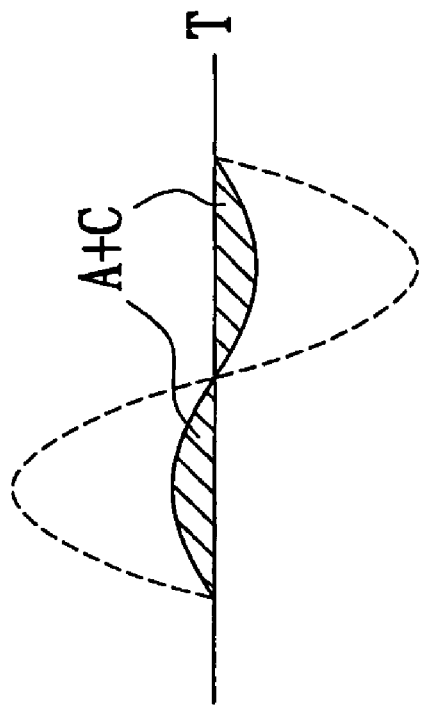
FIG. 2B is a schematic view of a current waveform of an active compensation device according to the present invention.
Figure 2A:
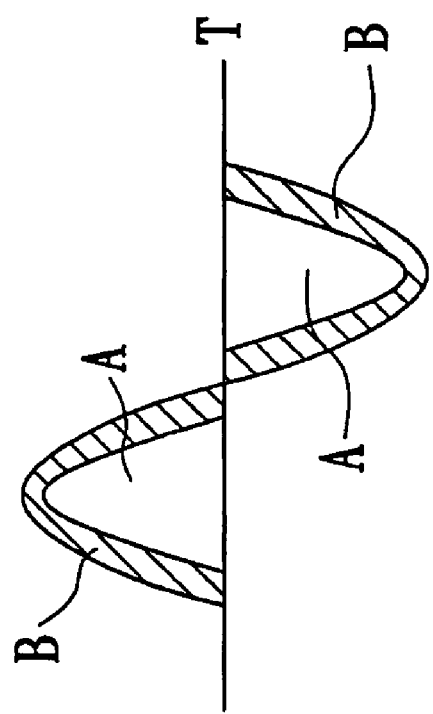
FIG. 2A is a schematic view of a whole current waveform according to the present invention.

Reference is shown as in FIG. 2A which is a schematic view of a whole current waveform according to the present invention. The power system 2 provides a periodic current that involves an area of a first load current A and an area of a no-load current B, and the first load current A is inputted directly to the non-linear load 3 but the no-load current B isn't used. Hence, the active compensation device 1 stores automatically the area of the no-load current B in the electricity-storing unit 20. When the non-linear load 3 needs larger instantaneous current that is the first load current A isn't sufficient to support the non-linear load 3, the electricity-storing unit 20 will output the compensation current C from the active compensation device 1 to the non-linear load 3.

Reference is shown as in FIG. 2B which is a schematic view of a current waveform of an active compensation device according to the present invention. The active compensation device 1 provides the compensation current C to the non-linear load 3 that the compensation current C combines the first load current A to form the stable and smooth periodic current.

Figure 3A:
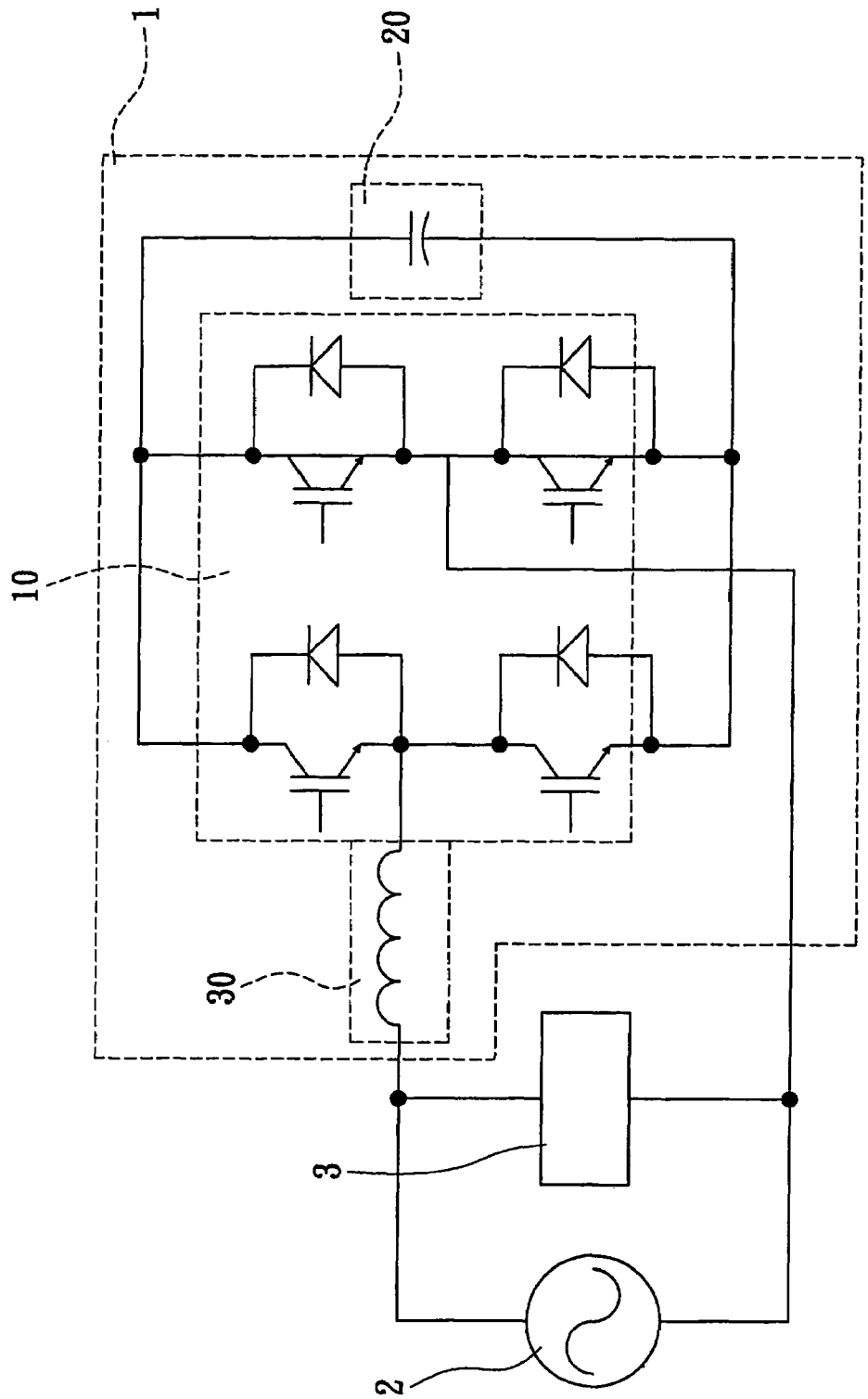
FIG. 3A is a circuit diagram of a first embodiment according to the present invention.

Reference is shown as in FIG. 3A which is a circuit diagram of a first embodiment according to the present invention. The active compensation device 1 is connected between the power system 2 and the non-linear load 3 in parallel. The bridge switching unit 10 is a full-bridge connection, the switches of the bridge switching unit 10 are the combination of the IGBTs and the diodes, and switches the electricity-storing unit 20 being charged or discharged by the controlling unit 40 (as shown in FIG. 1). In addition, the electricity-storing unit 20 is a capacitor.

Figure 3B:
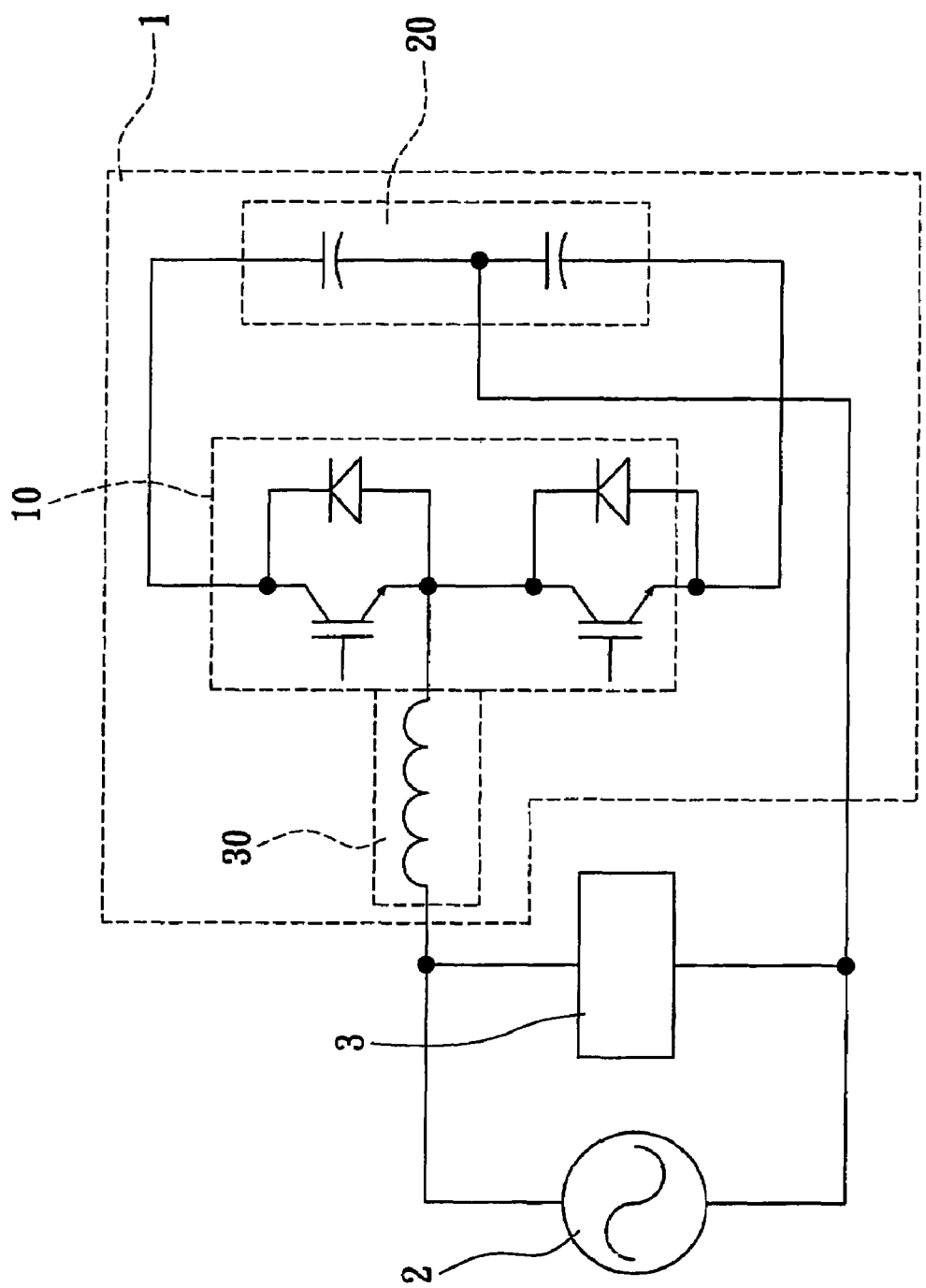
FIG. 3B is a circuit diagram of a second embodiment according to the present invention.

Reference is shown as in FIG. 3B which is a circuit diagram of a second embodiment according to the present invention. The difference in FIG. 3A is that the bridge switching unit 10 is a half-bridge connection so that the electricity-storing unit 20 is composed of two capacitors.

Figure 3C:
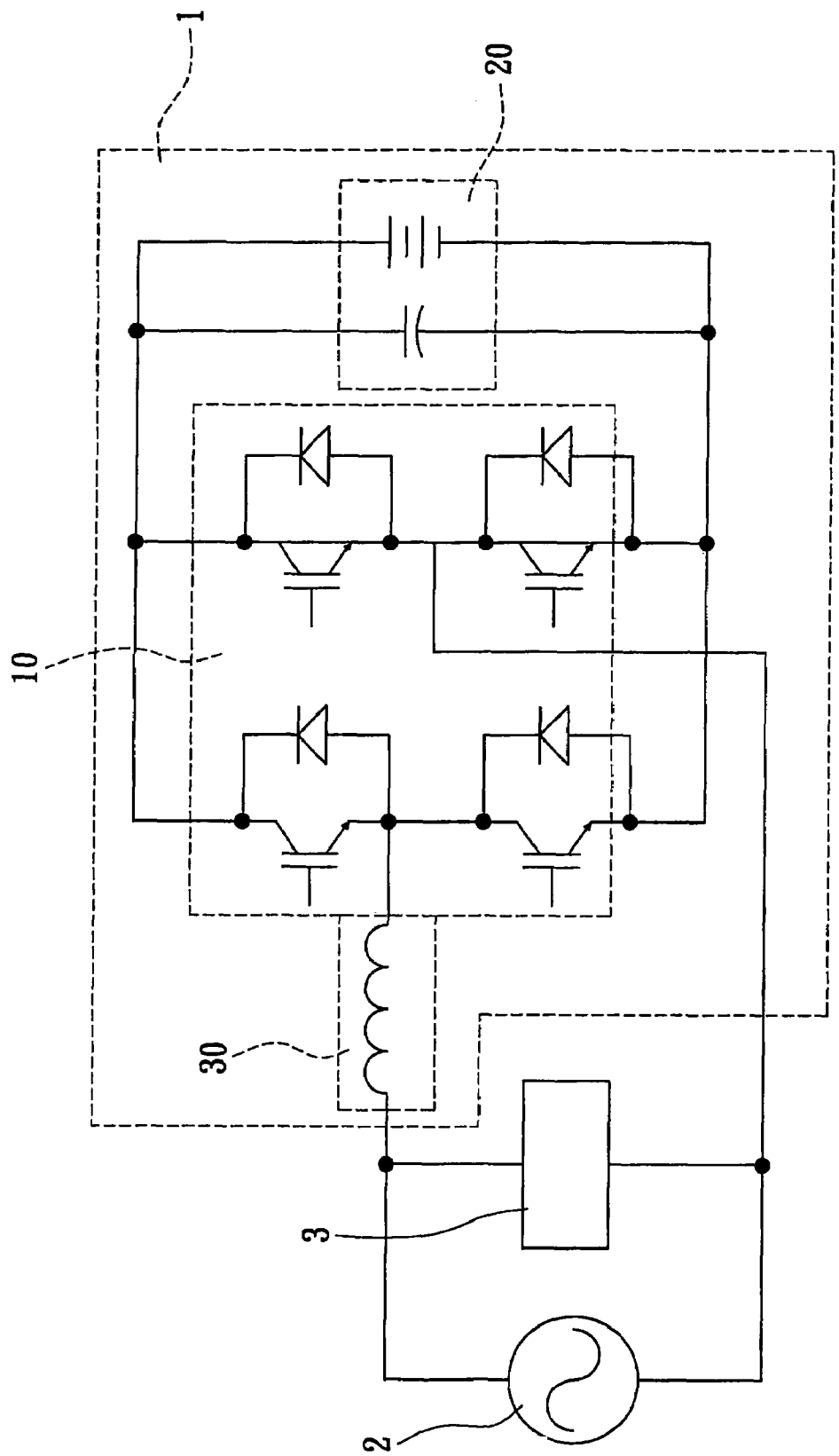
FIG. 3C is a circuit diagram of a third embodiment according to the present invention.

Reference is shown as in FIG. 3C which is a circuit diagram of a third embodiment according to the present invention. The difference in FIG. 3A is that the electricity-storing unit 20 is composed of a capacitor and a battery in parallel to supply current capacity so as to provide instantaneously the compensation current C more efficiently to the non-linear load 3.

It follows from what has been said that the active compensation device 1 stores the area of the no-load current B during the current transmission and provides the compensation current C to the non-linear load 3 when the non-linear load 3 consumes larger instantaneous current. In addition, the active compensation device 1 can be used with various power supply devices, as the Uninterruptible power supply (UPS) system. Whereby, it is not only to reduce costs to reconfigure the specific power line to achieve sufficient current capacity and power quality but also to reduce energy waste. Furthermore, the components of the active compensation device 1 designed are simplified, so it can collocate on other relevant power supply devices elastically and flexibly.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An active compensation device connected between a power system supplying a dual-direction periodic current wave and a non-linear load operating in a first load regime and in a second load regime, wherein said second load regime said non-linear load requires a larger current for operation of said non-linear load than in said first load regime, the active compensation device, comprising:

an electricity-storing unit;

a bridge switching unit including a plurality of switches, wherein said bridge switching unit is electrically connected with the electricity-storing unit; and a controlling unit generating control signals supplied to respective control switches of the bridge switching unit, wherein the dual-direction periodic current wave supplied from the power system includes a first load current portion occupying a first portion of said dual-direction periodic current wave, and a second load current portion occupying a remaining portion of said dual-direction current wave, wherein, in said first load regime of said non-linear load, said controlling unit controls said bridge switching unit to pass said first load current portion to said non-linear load, and to store said second load current portion in said electricity-storing unit, and wherein, in said second load regime of said non-linear load requires a larger current than in said first load regime, said active compensation device produces a compensation current corresponding to said second load current portion stored in said electricity-storing unit, and supplies said compensation current, in addition to said first load current portion of said dual-direction current wave, to said non-linear load.

2. The active compensation device as claimed in claim 1, wherein the non-linear load is an audio & video apparatus.

3. The active compensation device as claimed in claim 1, wherein the electricity-storing unit is a unit selected from the group consisting of at least one battery and at least one capacitor.

4. The active compensation device as claimed in claim 1, wherein the switches are insulated gate bipolar transistors (IGBTs) or the IGBTs combined with diodes.

5. The active compensation device as claimed in claim 1, wherein the switches are metal oxide semiconductor field effect transistors (MOSFETs).

6. The active compensation device as claimed in claim 1, wherein the bridge switching unit is full-bridge or half-bridge.

7. The active compensation device as claimed in claim 1, further comprising a filtering unit connected electrically with the bridge switching unit for filtering high frequency pulse current produced by the compensation current.

8. The active compensation device as claimed in claim 7, wherein the filtering unit is an inductor.

* * * * *